(12) United States Patent
Sato et al.

(10) Patent No.: US 11,887,825 B2
(45) Date of Patent: Jan. 30, 2024

(54) CONTROL METHOD AND PLASMA PROCESSING APPARATUS

(71) Applicant: Tokyo Electron Limited, Tokyo (JP)

(72) Inventors: Mikio Sato, Nirasaki (JP); Eiki Kamata, Nirasaki (JP); Taro Ikeda, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 606 days.

(21) Appl. No.: 17/076,463

(22) Filed: Oct. 21, 2020

(65) Prior Publication Data

US 2021/0125814 A1 Apr. 29, 2021

(30) Foreign Application Priority Data

Oct. 28, 2019 (JP) .................................. 2019-195656

(51) Int. Cl.
| | |
|---|---|
| *H01L 21/26* | (2006.01) |
| *H01J 37/32* | (2006.01) |
| *H01L 21/67* | (2006.01) |
| *C23C 16/50* | (2006.01) |
| *C23C 16/52* | (2006.01) |
| *H01L 21/66* | (2006.01) |

(52) U.S. Cl.
CPC ........ *H01J 37/32972* (2013.01); *C23C 16/50* (2013.01); *C23C 16/52* (2013.01); *H01J 37/3222* (2013.01); *H01L 21/67069* (2013.01); *H01L 21/67253* (2013.01); *H01L 22/26* (2013.01); *H01J 2237/332* (2013.01); *H01J 2237/334* (2013.01)

(58) Field of Classification Search
CPC ............ H01J 37/32935; H01J 37/3222; H01J 37/32192; H01J 37/32266; H01J 37/32256; H01J 37/32972; H05H 1/46; H01L 21/67253; H01L 22/26
See application file for complete search history.

(56) References Cited

U.S. PATENT DOCUMENTS

| | | | | |
|---|---|---|---|---|
| 10,460,913 | B2 * | 10/2019 | Tamari | ............... H01J 37/32311 |
| 11,081,345 | B2 * | 8/2021 | Suzuki | ................... C23C 16/402 |
| 11,152,269 | B2 * | 10/2021 | Ikeda | ....................... C23C 14/54 |

(Continued)

FOREIGN PATENT DOCUMENTS

| | | |
|---|---|---|
| JP | 2003188154 A | 7/2003 |
| JP | 2006278642 A | 10/2006 |

(Continued)

*Primary Examiner* — Jaehwan Oh
(74) *Attorney, Agent, or Firm* — Nath, Goldberg & Meyer; Jerald L. Meyer; Tanya E. Harkis

(57) ABSTRACT

A method of controlling a scanning-type plasma processing apparatus using a phased array antenna, includes observing light emission of plasma generated inside a processing container through observation windows provided at multiple positions in the processing container, calculating an in-plane distribution of values representing characteristics of the plasma on a substrate, based on data on the observed light emission of the plasma, and correcting a scanning pattern and/or a plasma density distribution of the plasma based on the calculated in-plane distribution of the values representing the characteristics of the plasma on the substrate.

11 Claims, 12 Drawing Sheets

(56) References Cited

U.S. PATENT DOCUMENTS

| | | | | |
|---|---|---|---|---|
| 2005/0009347 A1* | 1/2005 | Matsumoto | ....... | H01J 37/32174 |
| | | | | 257/E21.252 |
| 2008/0210376 A1* | 9/2008 | Maeda | .............. | H01J 37/32082 |
| | | | | 118/712 |
| 2017/0133202 A1* | 5/2017 | Berry, III | .......... | H01J 37/32449 |
| 2018/0342374 A1* | 11/2018 | Liang | ................... | H01J 37/3211 |
| 2019/0006153 A1* | 1/2019 | Tamari | .............. | H01J 37/32678 |
| 2019/0189398 A1* | 6/2019 | Ikeda | ....................... | B01J 19/08 |
| 2021/0082727 A1* | 3/2021 | Ikeda | ............... | H01L 21/67017 |

FOREIGN PATENT DOCUMENTS

| | | | |
|---|---|---|---|
| JP | 2010-170974 | A | 8/2010 |
| JP | 2017103454 | A | 6/2017 |
| KR | 1020010082664 | A | 8/2001 |
| KR | 10-2018-0051429 | A | 5/2018 |

\* cited by examiner

FIG. 6
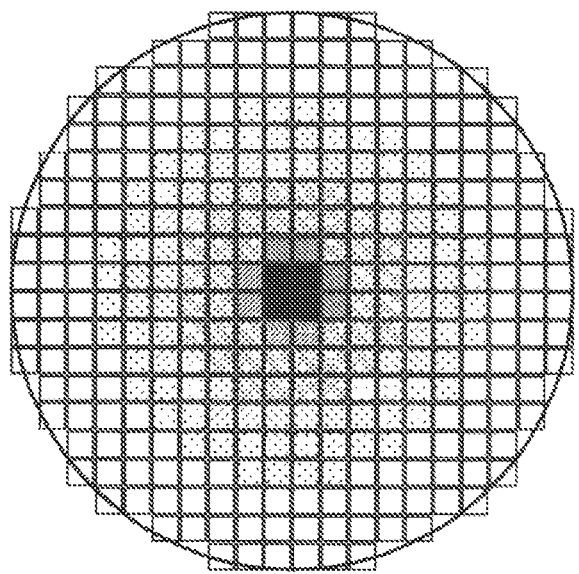
Ideal value of plasma density distribution : $\rho_0(x,y,t)$
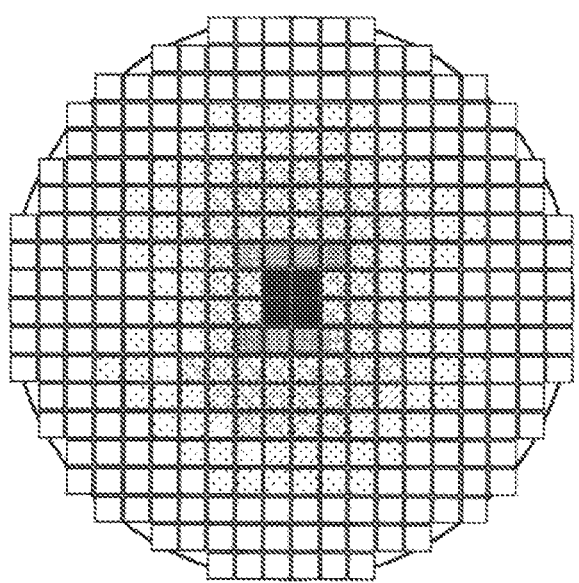
Estimated value of plasma density distribution : $\rho(x,y,t)$

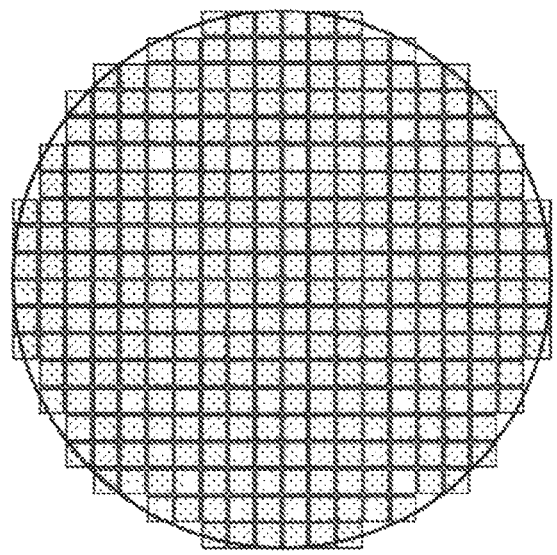
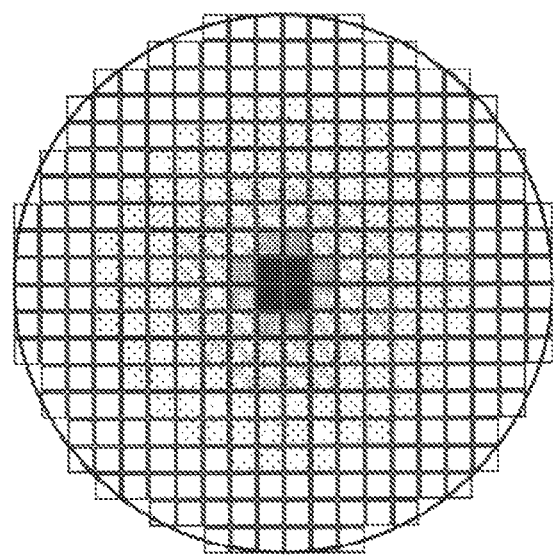
FIG. 11

CONTROL METHOD AND PLASMA PROCESSING APPARATUS

CROSS-REFERENCE TO RELATED APPLICATION

This application is based upon and claims the benefit of priority from Japanese Patent Application No. 2019-195656, filed on Oct. 28, 2019, the entire contents of which are incorporated herein by reference.

TECHNICAL FIELD

The present disclosure relates to a control method and a plasma processing apparatus.

BACKGROUND

There is known a plasma processing apparatus that performs plasma processing on a wafer by converting gas into plasma with the power of electromagnetic waves. For example, Patent Document 1 proposes a method of correcting a reaction rate on a semiconductor substrate within a processing container using a phased array microwave antenna, in which plasma is excited within the processing container, microwave radiation beams are radiated from the phased array microwave antenna, and the beams are directed to the plasma so as to change the reaction rate on the surface of the semiconductor substrate within the processing container.

PRIOR ART DOCUMENT

Patent Document

Patent Document 1: Japanese Laid-Open Patent Publication No. 2017-103454

SUMMARY

According to embodiments of the present disclosure, there is provided a method of controlling a scanning-type plasma processing apparatus using a phased array antenna, includes observing light emission of plasma generated inside a processing container through observation windows provided at multiple positions in the processing container, calculating an in-plane distribution of values representing characteristics of the plasma on a substrate, based on data on the observed light emission of the plasma, and correcting at least one or more of scanning pattern and a plasma density distribution of the plasma based on the calculated in-plane distribution of the values representing the characteristics of the plasma on the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a view showing examples of actually measured values and ideal values of a plasma density distribution according to an embodiment.

FIG. 11 is a view for describing the effects of a control method according to an embodiment.

DETAILED DESCRIPTION

Figure 1:
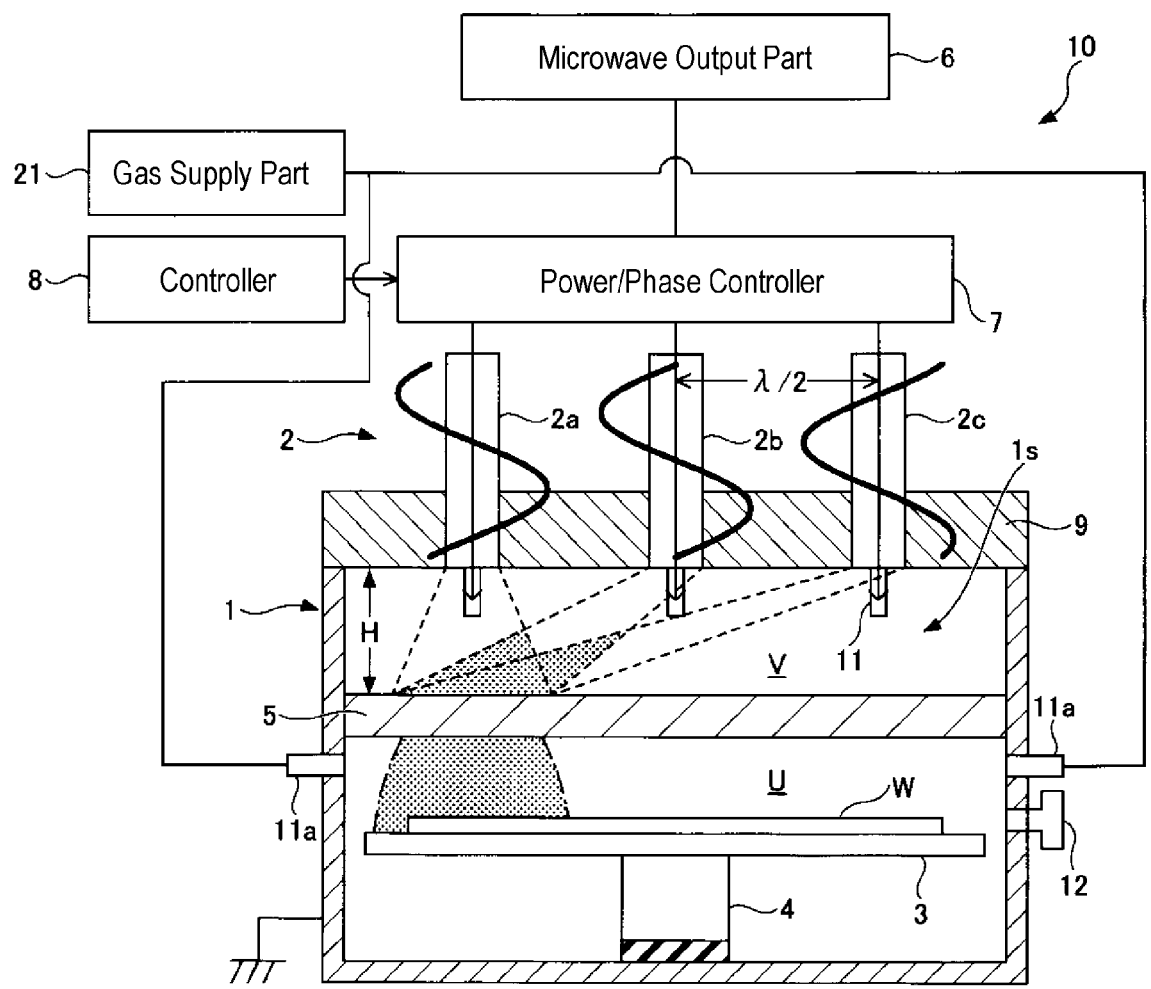
FIG. 1 is a schematic cross-sectional view illustrating an exemplary plasma processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the accompanying drawings. In each of the drawings, the same components are denoted by the same reference numerals, and redundant descriptions may be omitted.

[Plasma Processing Apparatus]

A plasma processing apparatus 10 according to an embodiment will be described with reference to FIG. 1. FIG. 1 is a schematic cross-sectional view illustrating an exemplary plasma processing apparatus 10 according to an embodiment. The plasma processing apparatus 10 is described by taking microwave plasma processing apparatus as an example.

The plasma processing apparatus 10 according to an embodiment includes a processing container 1 configured to accommodate therein a substrate W such as a wafer. The inside of the processing container 1 is a processing chamber is for performing predetermined plasma processing such as a film forming process and an etching process on a substrate W by surface wave plasma formed by microwaves.

The processing container 1 has a substantially cylindrical shape and is grounded. The upper opening of the processing container 1 is closed by a ceiling wall 9, whereby it is possible to keep the inside airtight. The processing container 1 and the ceiling wall 9 are formed of a metal material such as aluminum or stainless steel.

A stage 3 on which a substrate W is placed is supported by a cylindrical support member 4 extending from the center of the bottom portion of the processing container 1. The stage 3 may be provided with, for example, an electrostatic chuck for electrostatically attracting a substrate W, a temperature control mechanism, and a gas flow path for supplying a heat transfer gas to the rear surface of the substrate W. A high-frequency bias power supply may be electrically connected to the stage 3 via a matcher. However, the high-frequency bias power supply may not be provided depending on the characteristics of plasma processing.

An exhaust pipe is connected to the bottom portion of the processing container 1, and an exhaust apparatus including a vacuum pump is connected to the exhaust pipe. When the exhaust apparatus is operated, the inside of the processing container 1 is exhausted, so that the inside of the processing container 1 is depressurized to a predetermined degree of vacuum. The side wall of the processing container 1 is provided with a loading/unloading port for loading/unloading a substrate W therethrough and a gate valve for opening/closing the loading/unloading port.

A plurality of gas pipes 11a is formed in the processing container 1, and the gas supplied from a gas supply part 21 is supplied to the processing chamber is through the plurality of gas pipes 11a.

The ceiling wall 9 is provided with a phased array antenna 2 including seven monopole antennas 2a to 2g (only monopole antennas 2a to 2c are illustrated in FIG. 1) that radiate microwaves into the processing container 1. The phased array antenna 2, which is formed of a plurality of monopole antennas, radiates electromagnetic waves into the processing container 1. The number of monopole antennas is not limited to seven, and may be two or more, preferably three or more.

Figure 2:
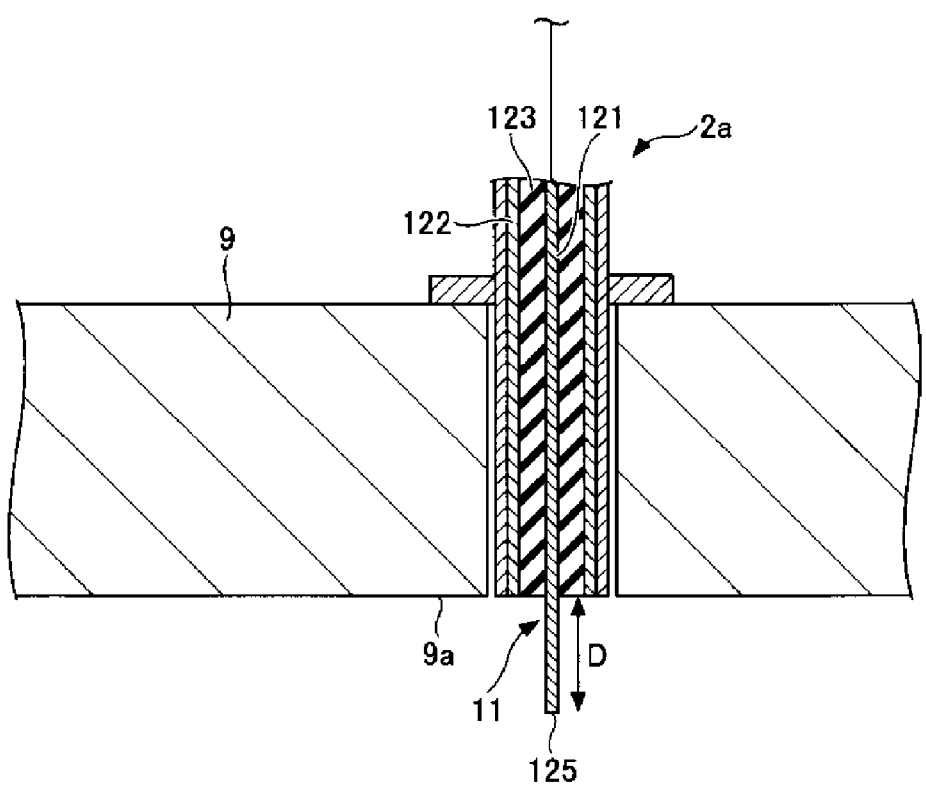
FIG. 2 is a view illustrating an exemplary monopole antenna according to an embodiment.

The monopole antennas 2a to 2g have the same configuration. Therefore, FIG. 2 illustrates an exemplary monopole antenna 2a as a representative, and illustrations and descriptions of the configurations of the other monopole antennas 2b to 2g are omitted. The monopole antenna 2a has a coaxial cable shape, and includes an inner conductor 121, an outer conductor 122 outside thereof, and a dielectric material 123 such as Teflon (registered trademark) provided therebetween. The tip end of the monopole antenna 2a constitutes an antenna part 11 including the inner conductor 121 protruding by a length D. The length D of the antenna part 11 is, for example, several tens of mm to several hundreds of mm By exposing the antenna part 11 to the inner space of the processing container 1 from the end portion of the dielectric material 123 on the surface having the same height as the rear surface 9a of the ceiling wall 9 of the processing container 1, microwaves are radiated into the processing container 1 from the radiation portion 125. However, the inner conductor 121 may be configured so as not to protrude from the dielectric material 123.

With such a configuration, as illustrated in FIG. 1, the microwaves are output from a microwave output part 6, and the power/phase controller 7 controls the power and/or phase under the control of the controller 8. After that, the microwaves are radiated into the processing container 1.

The monopole antennas 2a to 2g are provided at substantially equal intervals. The monopole antennas 2a to 2g are arranged such that the distance between the centers of adjacent ones is smaller than $\lambda/2$ with respect to the wavelength $\lambda$ of microwaves. A dielectric window 5 is arranged between the plurality of antenna parts 11 and the stage 3 so as to be spaced apart from them. The dielectric window 5 serves as a partition plate that divides the inside of the processing container 1 into a space V above the dielectric window 5 and a space U below the dielectric window 5. The dielectric window 5 is made of, for example, quartz, ceramic such as alumina ($Al_2O_3$), a fluorine-based resin such as polytetrafluoroethylene, or a polyimide-based resin.

In the space V below the monopole antennas 2a to 2g, there is a free space of about several tens of mm to several hundreds of mm, and plasma is generated in the space U through the dielectric window 5 installed therebelow. The distance H between the tip ends of the plurality of antenna parts 11 and the top surface of the dielectric window 5 is larger than $\lambda/4$ with respect to the wavelength $\lambda$ of microwaves. In the space V, a plurality of microwaves radiated from the monopole antennas 2a to 2g propagate. The space V is an atmospheric space, and the space U is a vacuum space.

The plasma processing apparatus 10 includes a controller 8. The controller 8 is a computer including, for example, a processor, a storage such as memory, an input part, a display, and a signal input/output interface, and controls each part of the plasma processing apparatus 10. A control program and recipe data are stored in the storage. A computer (CPU) executes a control program so as to control each part of the plasma processing apparatus 10 according to the recipe data. The computer also controls the power/phase controller 7 provided for each antenna part 11 of the phased array antenna 2 so as to control the power and/or phase of the microwave radiated from the antenna part 11.

When performing plasma processing in the plasma processing apparatus 10 having such a configuration, first, a substrate W is carried into the processing container 1 from the opened gate valve through the loading/unloading port in the state of being held on a transport arm.

When the substrate W is transported to a position above the stage 3, the substrate W is transported from the transport arm to a pusher pin, and the pusher pin descends to place the substrate W on the stage 3. The gate valve is closed after the substrate W is loaded. The pressure of the processing chamber is is maintained at a predetermined degree of vacuum by the exhaust apparatus. A predetermined gas is introduced into the space U below the dielectric window 5. Microwaves having controlled power and/or phase are radiated from the phased array antenna 2. Thus, the electric field is strengthened at a predetermined position of the dielectric window 5, the gas in the space U is turned into plasma, and thus local plasma is generated. It is possible to control the spatial distribution of time-integrated values of plasma density by scanning the generated local plasma, and thus uniform or desired plasma processing is performed on the substrate W.

The plasma processing apparatus 10 according to an embodiment controls the power and the phase of the microwave radiated from each of the monopole antennas 2a to 2g, using the power/phase controller 7 under the control of the controller 8. As a result, the microwaves emitted from the respective monopole antennas 2a to 2g cause interference, so that electric field strength can be increased at any place. This makes it possible to control the plasma density distribution at a high level by generating plasma in a concentrated manner The combination of microwaves performed by phase control as described above does not involve a mechanical operation, and thus can be controlled at extremely high speed. In principle, with the high-speed control as high as the frequency of microwaves, it is possible to move the focus position C of the combination of microwaves depending on time. Thus, it is possible to perform the power/phase control of the plurality of monopole antennas 2a to 2g at high speed. As a result, it is possible to control the plasma density distribution uniformly or freely.

Figure 3:
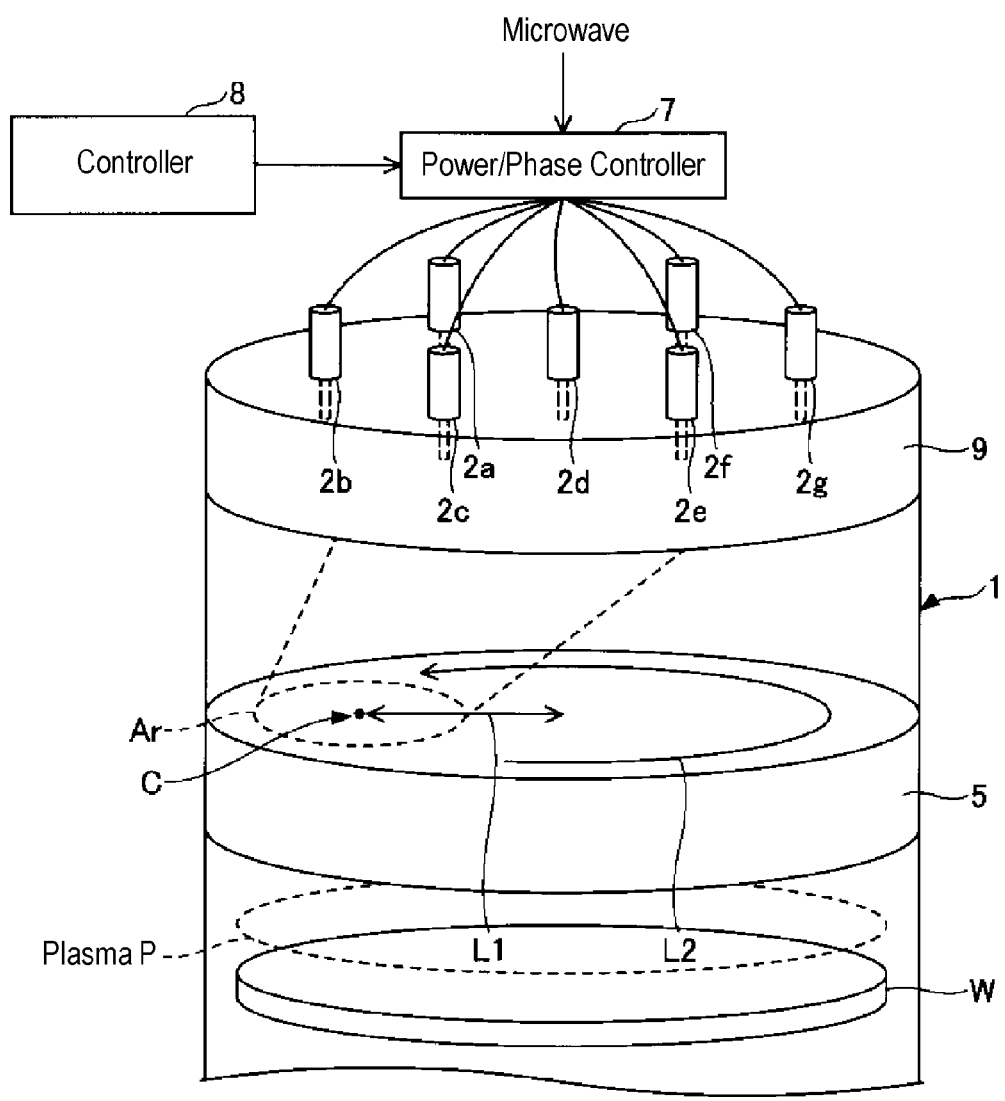
FIG. 3 is a view illustrating an example of power/phase control by a controller according to an embodiment.

FIG. 3 is a view illustrating an example of power/phase control by a controller 8 according to an embodiment. In the example of FIG. 3, the controller 8 controls the phases φ (xa) to φ (xg) of the microwaves radiated from the monopole antennas 2a to 2g so as to strengthen each other at the focus position C, using the power/phase controller 7. In addition, in order to control the electric field strength of the microwaves in a combination portion Ar around the focus position C, the power of microwaves radiated from each of the monopole antennas 2a to 2g is controlled.

The controller 8 controls the phases φ (xa) to φ (xg) of microwaves at high speed using the power/phase controller 7 such that the focus position C scans the surface of the dielectric window 5 in the radial direction L1 or the circumferential direction L2. In addition, the power of microwaves is controlled during scanning Thus, by controlling the power of microwaves while moving the focus position C and the combination portion Ar at high speed, it is possible to freely control the density distribution of the plasma P generated by the power of microwaves passing downwards through the dielectric window 5.

In addition, the controller 8 may change the moving speed of the combination portion Ar by changing the speed at which the phases φ (xa) to φ (xg) of microwaves are controlled using the power/phase controller 7. For example, the controller 8 slowly moves the combination portion Ar on the outer peripheral side of the dielectric window 5 and moves the combination portion Ar on the inner peripheral side faster than the outer peripheral side so as to control the phases φ (xa) to φ (xg) of microwaves, thereby changing the scanning speed. In addition, the power of microwaves is controlled during scanning As a result, it is possible to freely control the plasma density distribution. For example, it is possible to control the density of plasma on the outer peripheral side under the dielectric window 5 to be higher than the density of plasma on the inner peripheral side.

[Light Emission Monitoring Mechanism and Control Method]

Next, a method of controlling the power and/or phase of the scanning-type plasma processing apparatus 10 by the phased array antenna 2 having the above-described configuration will be described. In order to control the plasma density distribution to a desired distribution, it is important to appropriately control the scanning pattern of the local plasma and/or the plasma density distribution by controlling the power and/or phase output from the phased array antenna 2. In that case, a method of performing trial and error condition search by repeating processing of various substrates, and controlling the power and the phase according to the obtained search conditions consumes a large amount of resources such as substrates, labor, and time at the time of condition search, and is inefficient. In addition, a method of detecting an asymmetry or individual difference of plasma processing apparatuses 10 (hereinafter, also referred to as a "machine difference") and controlling the power and the phase according to the detected conditions has the same problem and is inefficient.

Figure 4:
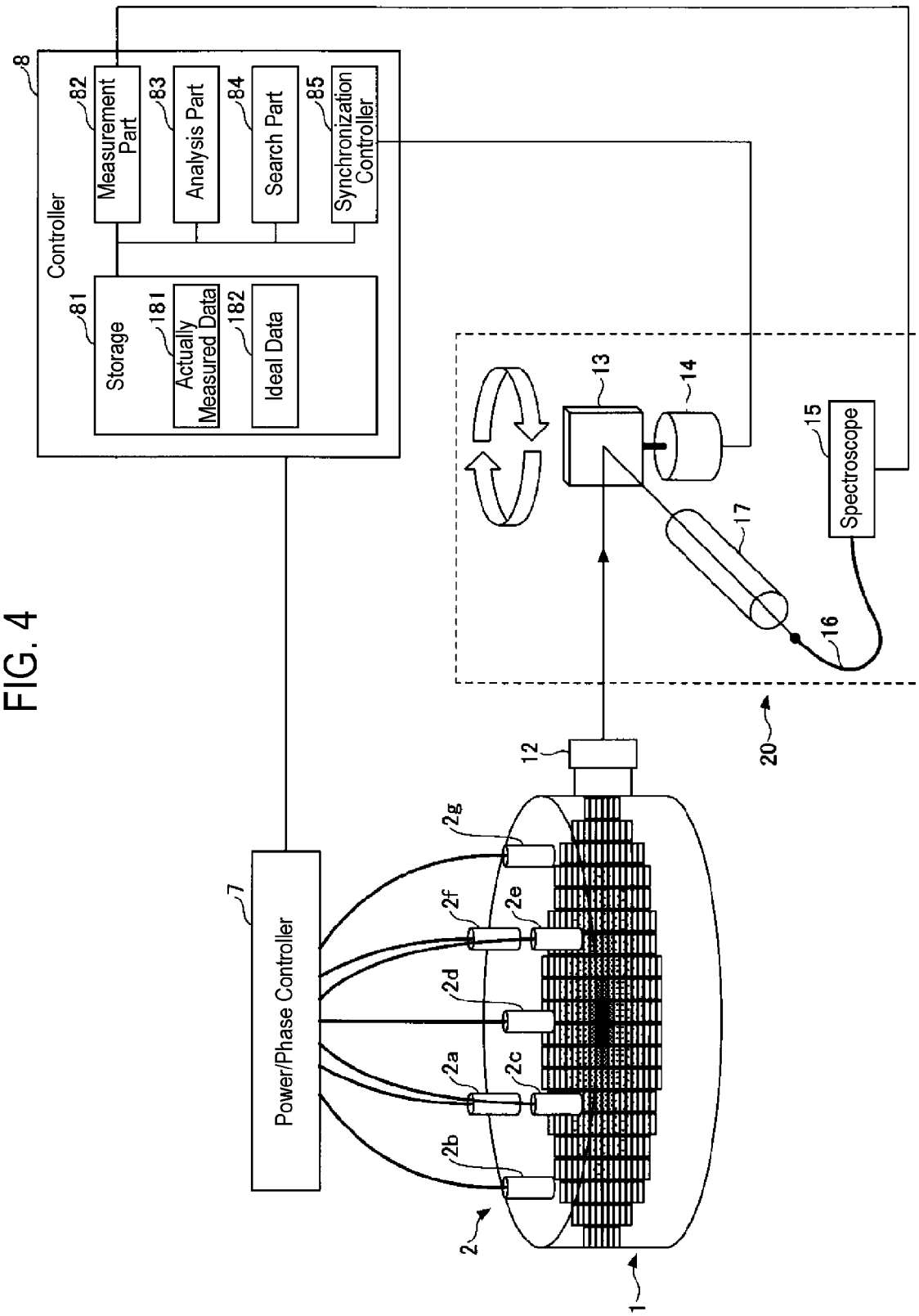
FIG. 4 is a view illustrating an exemplary light emission monitoring mechanism according to an embodiment.
Figure 5:
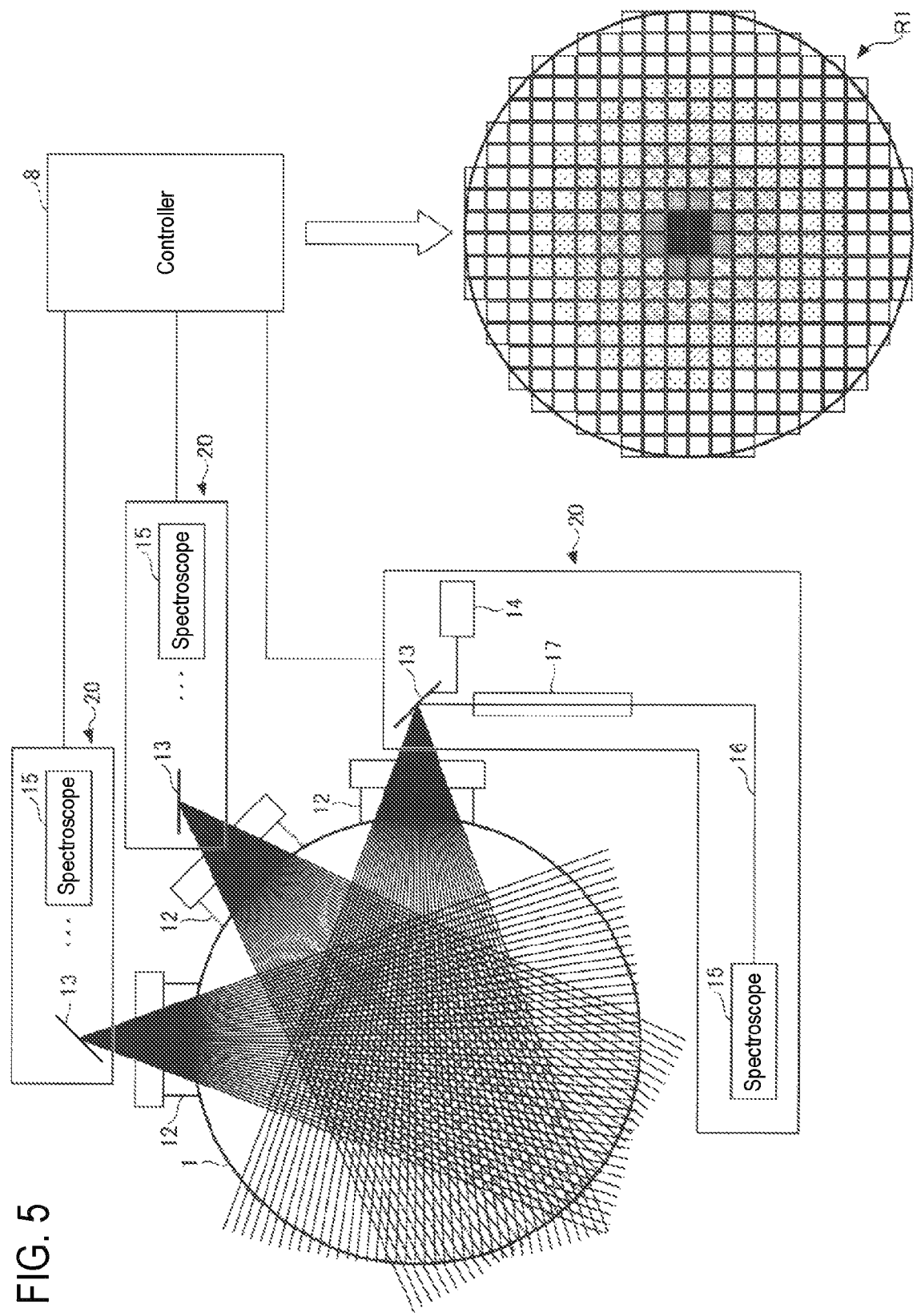
FIG. 5 is a view for describing optical emission spectroscopy according to an embodiment.

Therefore, the plasma processing apparatus 10 according to an embodiment includes a light emission monitoring mechanism 20 for observing light emission of plasma generated in the processing container 1 through observation windows 12 provided at multiple locations in the processing container 1. Further, based on the plasma emission intensity data obtained from the light emission monitoring mechanism 20, the power and/or phase output from the phased array antenna 2 are appropriately controlled. Hereinafter, an exemplary configuration of the light emission monitoring mechanism 20 will be described with reference to FIGS. 4 and 5. FIG. 4 is a view illustrating an exemplary light emission monitoring mechanism 20 according to an embodiment. FIG. 5 is a view for describing optical emission spectroscopy using the light emission monitoring mechanism 20 according to an embodiment.

As illustrated in FIG. 4, the light emission monitoring mechanism 20 includes a mirror 13, a motor 14, a spectroscope 15, an optical fiber 16, and a beam shaper 17. The beam shaper 17 includes, for example, a pinhole pair and a collimating lens, and shapes observation light (beam), and then the shaped beam is introduced into the spectroscope 15.

The mirror 13 rotates in the same direction by driving the motor 14. The spectroscope 15 is connected to the beam shaper 17 via an optical fiber 16. Plasma emission observed through the observation window 12 is reflected by the mirror 13, and only the light in a limited direction is incident on the spectroscope 15 via the beam shaper 17.

In this way, the spectroscope 15 selectively uses the light in the processing container 1 for optical emission spectroscopy (OES). The optical emission spectroscopy is one of the methods for monitoring the state of plasma. The spectroscope 15 qualifies the wavelength of an element-specific emission line spectrum (atomic spectrum) obtained by being excited by plasma using the optical emission spectroscopy, and performs quantification from emission intensity.

As illustrated in FIG. 5, light emission monitoring mechanisms 20 are provided in one-to-one correspondence with the observation windows 12. In the example of FIG. 5, three observation windows 12 formed of quartz are provided on the side wall of the processing container 1. Therefore, three light emission monitoring mechanisms 20 respectively corresponding to the three observation windows 12 are provided. A plurality of observation windows 12 and light emission monitoring mechanisms 20 may be provided. The light emission monitoring mechanisms 20 are provided in the same number as the observation windows 12.

Respective mirrors 13 of the three light emission monitoring mechanisms 20 rotate in synchronization. By combining these mirrors 13, it is possible to perform optical emission spectroscopy (angle-resolved measurement) in various directions of the processing container 1. That is, the spectroscope 15 measures the emission intensity at each angle using the light observed through the three observation windows 12. The actual measurement data of the measured emission intensity (emission intensity data) is transmitted to the controller 8. The emission intensity data is an example of data regarding plasma emission.

Based on the acquired emission intensity data, the controller 8 reconstructs an emission intensity distribution at each position indicated by two-dimensional coordinates (x, y) of a specific height within the processing container 1 corresponding to the plasma P within the processing container 1 (see FIG. 3). The original emission intensity distribution is estimated by observing light from the three observation windows 12, inversely transforming the light based on the principle of CT scanning, and back-projecting the result. It is considered that a back-projected image approximately corresponds to the density distribution of various excited particles or the plasma density distribution. Therefore, the back-projected image may be used as information for estimating the distribution of process results. For example, the plasma density distribution on a substrate W can be estimated from the reconstructed back-projected image. The image R1 shown in FIG. 5 may be shown as an image of a back-projected emission intensity distribution, or may be shown as a plasma density distribution estimated based on the emission intensity distribution.

That is, the controller 8 calculates an in-plane plasma density distribution on a substrate W based on the plasma emission intensity data observed by the light emission monitoring mechanism 20, and corrects a plasma scanning pattern based on the calculated plasma density distribution. The plasma density distribution is an exemplary in-plane distribution on a substrate W of values indicating plasma characteristics. Examples of values indicating plasma characteristics may be any of the density of plasma, the emission intensity of plasma, the processing rate of a substrate by plasma, or values indicating processing results of the substrate W by plasma. Examples of substrate-processing rates may include a film forming rate, an etching rate, an ashing rate, and a cleaning rate. Examples of values indicating processing results of the substrate W may include a thickness of a film formed on a substrate W, a resistance value of the film, a CD value when the substrate W is etched, an etching shape, and an etching depth.

[Control of Power and/or Phase]

In generating local plasma using the phased array antenna 2, the combination portion Ar in FIG. 3 may spread, or, for example, when it is desired to generate a round plasma, the plasma may be distorted. In contrast, in a control method according to the embodiment described below, by controlling the power and/or phase output from each antenna part 11 of the phased array antenna 2, the scanning pattern and/or plasma density distribution of local plasma are controlled (corrected). This proposes a method of performing desired plasma processing on a substrate W by controlling a plasma density distribution in the space U. That is, by controlling the power and/or phase of each antenna part 11 of the phased array antenna 2, the scanning path, the scanning speed, and the plasma density distribution of the local plasma are adjusted, and the spatial distribution of time-integrated values of plasma density is corrected.

For example, when the density distribution ($\rho(x, y, t)$) of local plasma is distorted and is far from ideal (for example, it is desired that the distribution is round, but the distribution is not round), even if the scanning pattern of the local plasma is adjusted, there is a high possibility that the time integrated value ($\int \rho(x, y, t) dt$) may not have a uniform or desired shape. In this case, the density distribution $\rho(x, y, t)$ of the local plasma is corrected by making a standard deviation $\sigma$ represented by Equation 1 described later as small as possible. In this case, the Markov chain Monte Carlo method is used such that the standard deviation $\sigma$ is minimized In order to perform the control method according to the embodiment, the density distribution of plasma generated using the phased array antenna 2 is measured by an optical emission spectroscopic method, and the measured emission intensity data is used to perform a parameter search using the Markov chain Monte Carlo method. The parameter search is a method that is performed using the power and/or phase of each antenna part 11 of the phased array antenna 2 as a parameter so as to obtain the optimum value of the parameter by the Markov chain Monte Carlo method.

For example, FIG. 6 is a view showing examples of estimated values and ideal values of a plasma density distribution according to the embodiment. The left side of FIG. 6 shows an example of estimated values of a plasma density distribution obtained based on actually measured emission intensity data by measuring the emission intensity of plasma. Below, the estimated values of the plasma density distribution is represented by $\rho(x, y, t)$.

The right side of FIG. 6 shows an example of ideal values of a plasma density distribution. Below, the ideal values of the plasma density distribution are represented by $\rho_0(x, y, t)$.

The plasma density distribution $\rho_0$ is a plasma density distribution that is actually desired to be generated.

The plasma density distributions $\rho$ and $\rho_0$ are two-dimensional plasma density distributions (x, y) in the space on a substrate W at a certain time t, and are substantially proportional to the plasma density distribution on the substrate W. In the parameter search described below, the appropriate values of the parameters of the power p and the phase $\varphi 0$ output from each antenna part 11 of the phased array antenna 2 are searched such that the plasma density distribution $\rho$ approaches the plasma density distribution $\rho_0$. Based on this, it is possible to set the processing of a substrate W to an ideal state or to bring the processing of the substrate W close to the ideal state.

The parameter search using the Markov chain Monte Carlo method may be performed during development of the plasma processing apparatus 10 or after maintenance. Further, in order to cope with a difference in plasma density distribution due to a machine difference in plasma processing apparatuses 10 and a change in plasma density distribution due to aging of plasma processing apparatuses 10, it may be performed for each plasma processing apparatus 10 or after a lapse of a predetermined time. From the parameter search using the Markov chain Monte Carlo method, the power p and the phase $\varphi$ of each antenna part 11 of the phased array antenna 2 are controlled to have appropriate values. As a result, it is possible to bring the plasma density distribution of each plasma processing apparatus 10 close to ideal values in coping with the adjustment of a machine difference and a change due to aging without replacing components used in the plasma processing apparatus 10.

The parameter search using the Markov chain Monte Carlo method is preferably executed by the controller 8, for example, when a process is developed or when a recipe used in the plasma processing apparatus 10 is changed. As illustrated in FIG. 4, the controller 8 includes a non-transitory storage 81, a measurement part 82, an analysis part 83, a search part 84, and a synchronization controller 85. The storage 81 stores, for example, actual measurement values of emission intensity and/or estimated values of a plasma density distribution as actual measurement data 181, together with the ideal data 182 of the plasma density distribution. The storage 81 also stores data such as recipe data, a program that executes an algorithm of the Markov chain Monte Carlo method, and appropriate values of parameters.

The synchronization controller 85 synchronously controls the motor 14 that rotates the mirror 13, the spectroscope 15 that measures emission intensity, and the power-feeding system that controls power distribution and phase to each antenna part 11 of the phased array antenna 2. In a state in which the mirror 13 synchronously controlled in this way continues to rotate in one direction by the motor 14, first, the power p and the phase $\varphi$ of each antenna part 11 of the phased array antenna 2 are set to appropriate values (initial values) so as to supply power and gas is supplied into the processing container 1 so as to generate plasma.

The spectroscope 15 measures the emission intensity of plasma only when the mirror 13 faces the observation window 12. The measurement part 82 acquires measured emission intensity data. The analysis part 83 reconstructs the plasma density distribution $\rho$ based on the acquired emission intensity data (see the plasma density distribution $\rho$ in FIG. 6).

The search part 84 executes the Markov chain Monte Carlo method program using the obtained plasma density distribution $\rho$, and determines a parameter to be used next by each antenna part 11 of the phased array antenna 2. Power is supplied from each antenna part 11 of the phased array antenna 2 based on the determined parameter.

Thus plasma is generated with a new parameter. The spectroscope 15 performs spectroscopic measurement again, and the measurement part 82 acquires measured emission intensity data. The analysis part 83 reconstructs the new plasma density distribution ρ based on the acquired emission intensity data. The search part 84 uses the obtained new plasma density distribution ρ to determine a parameter to be used next by each antenna part 11 of the phased array antenna 2. The controller 8 repeatedly executes a series of operations of parameter search (measurement→analysis-→search) until the Markov chain is sufficiently performed.

Figure 7:
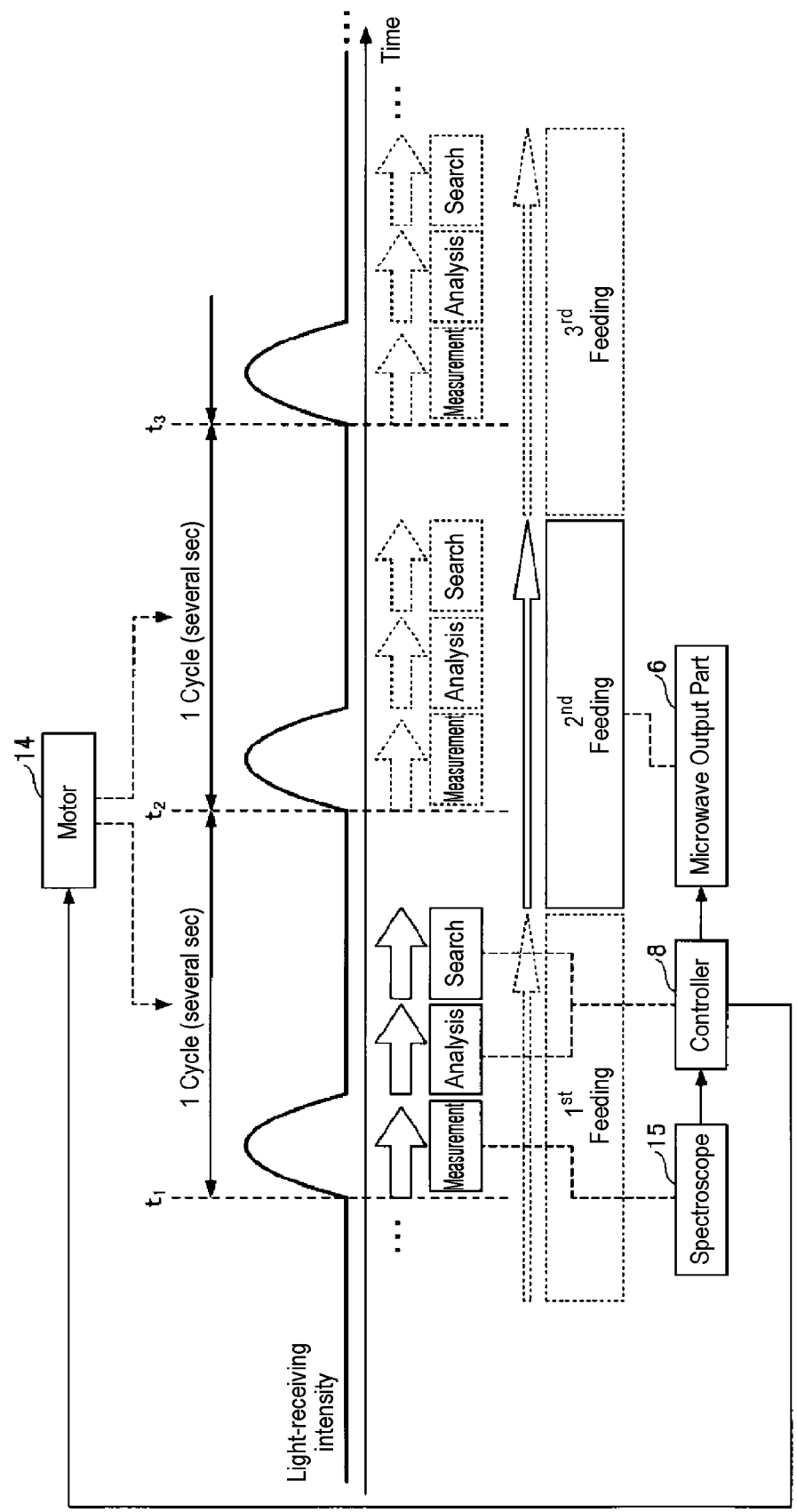
FIG. 7 is a view schematically illustrating a series of operations for parameter search.

FIG. 7 is a view schematically illustrating a series of operations for parameter search. When a mismatch occurs between the rotation cycle of the motor 14 and the operation timing of each of machines of the spectroscope 15, the controller 8, and the microwave output part 6, the parameter search will not be established. Therefore, the state of the motor 14 is constantly monitored by the synchronization controller 85 such that a mismatch in timing does not occur between a series of operations for parameter search (measurement, analysis, search, and power feeding). Hereinafter, a series of operations for parameter search (measurement, analysis, search, and power feeding) will also be referred to as "parameter search operation".

The synchronization controller 85 constantly monitors and controls whether or not a mismatch between the rotation cycle of the motor 14 and the parameter search operation is accumulated so as to stabilize the rotation speed of the motor 14 such that the rotation cycle of the motor 14 becomes equal to the step of parameter search operation. Since the time required for analysis and search may also vary slightly, the rotation cycle of the motor 14 is set with a margin.

The parameters of the power and the phase of each antenna part 11 of the phased array antenna 2 do not change until the next power feeding starts. That is, the state of plasma basically does not change until the next power feeding starts. Therefore, the emission intensity of plasma can be measured while the state of the plasma remains unchanged, that is, until the next power feeding starts. However, the emission intensity of plasma can be measured only when the mirror 13 faces the observation window 12.

Adjusting the power p and the phase φ such that the estimated value ρ of the plasma density distribution approaches the ideal value ρ₀ of the plasma density distribution means setting the matrix A of the vector space of the power p and the phase φ such that a standard deviation σ represented by Equation 1 becomes the minimum or becomes smaller than a predetermined threshold.

The standard deviation σ is represented by Equation 1.

$$\sigma = \sqrt{\sum_{x,y}(\rho - \rho_0)^2} \quad \text{[Equation 1]}$$

The matrix A is represented as follows.

$$A = \begin{pmatrix} p_1 \\ \vdots \\ p_n \\ \varphi_1 \\ \vdots \\ \varphi_{n-1} \end{pmatrix} \quad \text{[Equation 2]}$$

The matrix A is composed of powers $p_1$ to $p_n$ and phases $\varphi_1$ to $\varphi_{n-1}$ of microwaves output from n antenna parts 11 in order to obtain plasma density ρ at a position specified by two-dimensional coordinates (x, y) in the space U on a substrate W.

Figure 8:
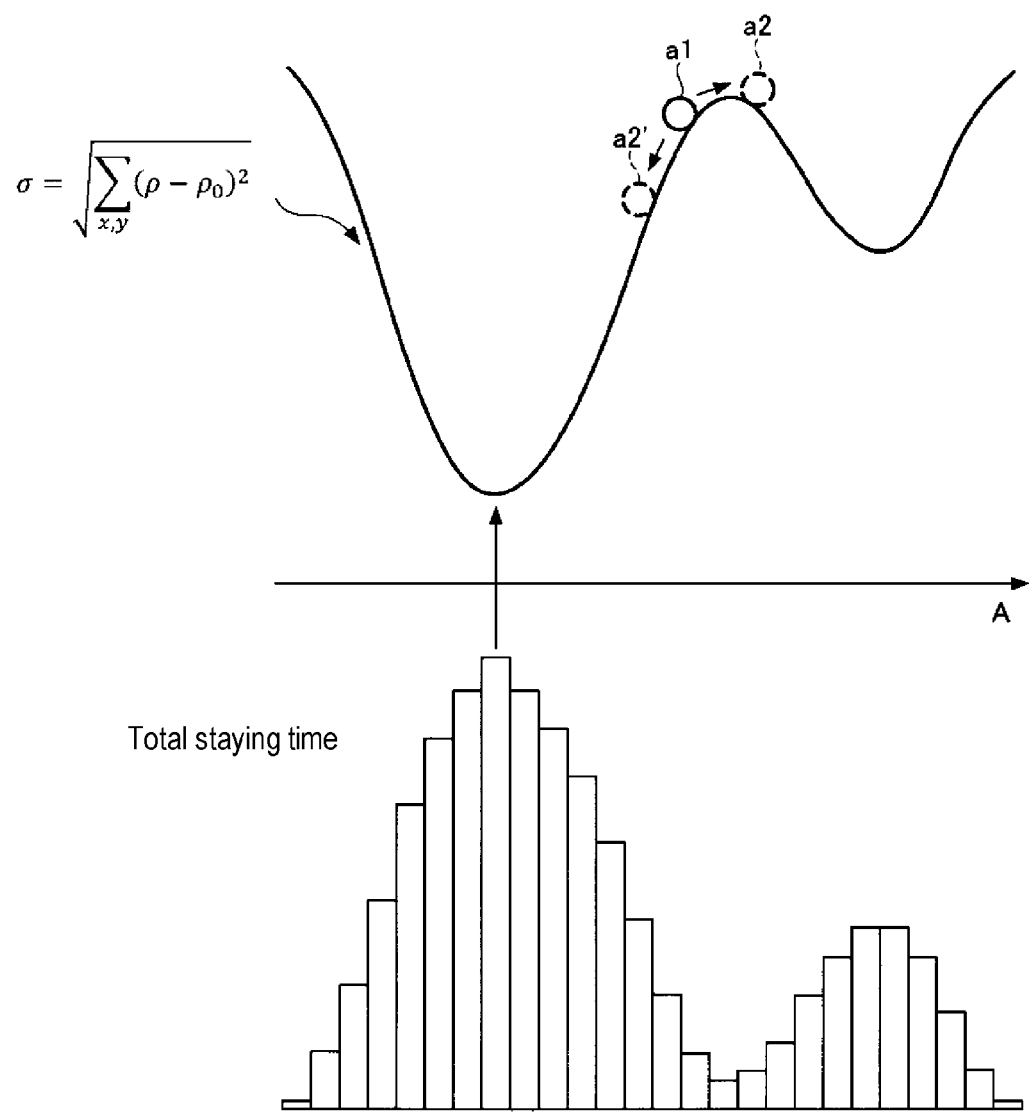
FIG. 8 is a view for describing the outline of parameter search.

In order to set the matrix A in the vector space of the power p and the phase φ such that the standard deviation σ becomes the minimum, the search part 84 performs a parameter search of the power p and the phase φ by the Markov chain Monte Carlo method. FIG. 8 is a view for explaining the outline of the parameter search.

The search part 84 sets the power p and the phase φ of each antenna part 11 of the phased array antenna 2 to appropriate initial parameters and starts the search. The horizontal axis of FIG. 8 represents the matrix A. The curve in FIG. 8 (top) represents the standard deviation σ indicating a deviation between an estimated value ρ of a plasma density distribution obtained as a result of the parameter search and an ideal value ρ₀ of a plasma density distribution.

The initial parameters are initial values of the power p and the phase φ of each antenna part 11 of the phased array antenna 2 set in the matrix A. In FIG. 8, the standard deviation σ when the powers $p_1$ to $p_n$ and the phases $\varphi_1$ to $\varphi_{n-1}$ of the matrix A are set as initial parameters is indicated as "a1".

In the first one cycle ($t_1$ to $t_2$) represented in FIG. 7, the first power feeding is performed from each antenna part 11 of the phased array antenna 2 with the power p and the phase φ of the initial parameters. In the next step of the parameter search, that is, in the next one cycle ($t_2$ to $t_3$) represented in FIG. 7, whether to move to another position or to stay at the current position is probabilistically determined, and as the standard deviation σ becomes closer to 0, the probability of staying at the current position increases. The "staying" here may be a process of simply adding a value to a histogram indicating a staying time on a computer without staying in time. This makes it possible to shorten the processing time. Moving to another position means changing the power and/or the phase of a parameter. In the example of FIG. 8, the standard deviations σ when the parameters of the matrix A are changed are indicated by a2 and a2'. The direction when moving to another position is randomly determined. That is, whether the standard deviation σ changes from a1 to a2 or from a1 to a2' is randomly determined.

Specifically, the probability of moving to another position is determined depending on the amount of change in the standard deviation σ which is an objective function. The amount of change in the objective function is determined by the amount of change in the power p and/or the phase φ fed from each antenna part 11 of the phased array antenna 2 in each cycle.

The histogram in FIG. 8 (bottom) represents the total staying time. This histogram shows at which position the standard deviation σ stays when the power p and/or the phase φ fed from each antenna part 11 of the phased array antenna 2 in each cycle is changed, and reflects the objective function.

The search part 84 repeats the parameter search operation a predetermined number of times, such as 1000 times. The predetermined number of times is the number of times where the histogram representing the total staying time for which the standard deviation σ stayed is obtained, and may be set in advance. However, the present disclosure is not limited thereto, and the search part 84 may terminate the parameter search operation when the staying time becomes equal to or greater than the threshold. The standard deviation σ corresponding to the longest staying time is likely to be the smallest standard deviation σ that can be realized, and the power p and the phase φ represented by the matrix A corresponding to the standard deviation σ at that time are determined to be the power p and the phase φ at which the plasma density distribution ρ comes closest to the plasma density distribution $\rho_0$.

[Method for Controlling Parameter Search]

Figure 9:
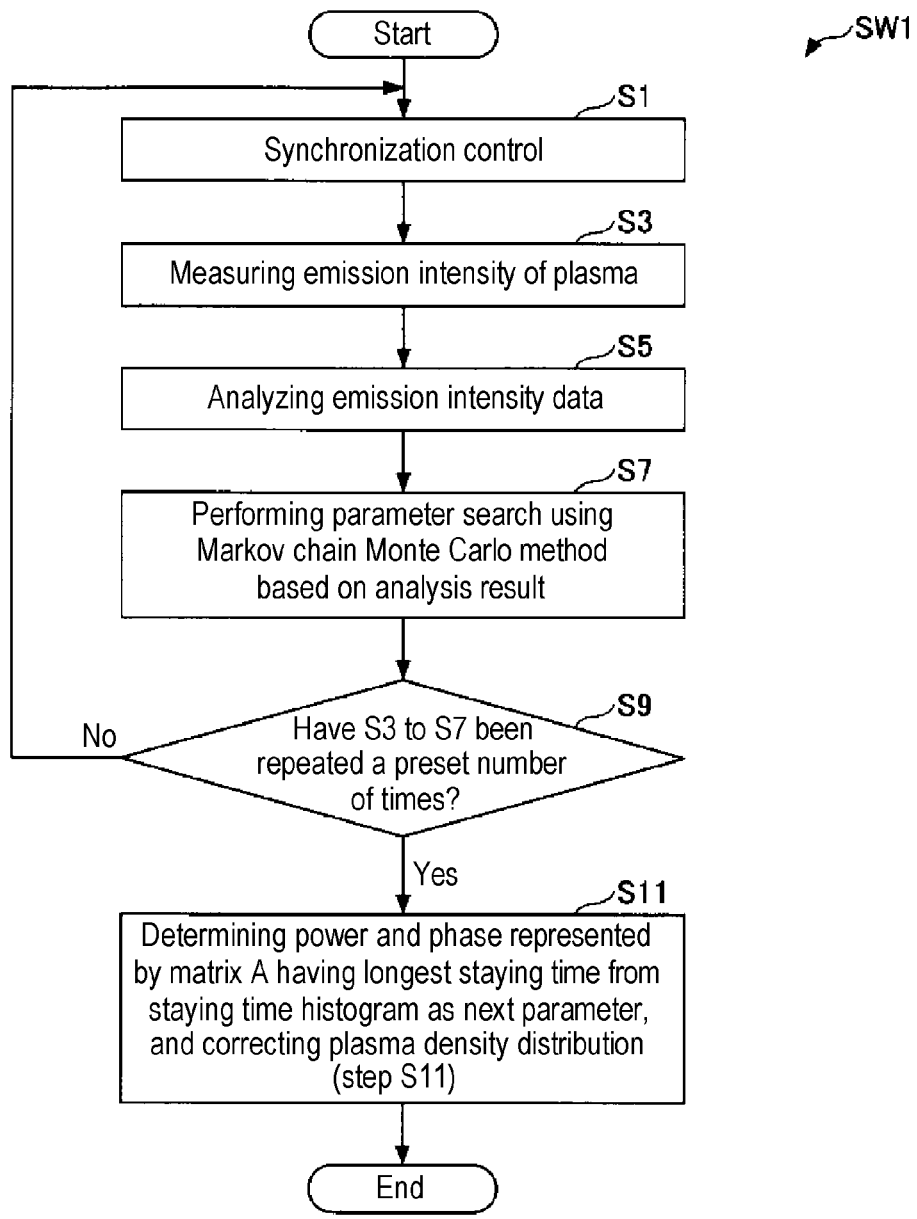
FIG. 9 is a flowchart illustrating an exemplary control method (parameter search) according to an embodiment.

Next, an exemplary control method (parameter search) SW1 executed by the plasma processing apparatus 10 will be described with reference to FIG. 9. FIG. 9 is a flowchart illustrating an exemplary control method SW1 according to an embodiment. This processing is controlled by the controller 8.

When this processing is initiated, the synchronization controller 85 synchronously controls the motor 14 that rotates the mirror 13, the spectroscope 15 that measures emission intensity, and the power-feeding system that controls power distribution and phase for each antenna part 11 of the phased array antenna 2 (step S1).

Next, the measurement part 82 measures plasma emission intensity for light beams at a plurality of angles incident from the plurality of observation windows 12 using the spectroscope 15 (step S3). Next, the analysis part 83 analyzes measured emission intensity data, reconstructs the emission intensity distribution, and estimates the plasma density distribution (step S5).

Next, the search part 84 performs a parameter search using the Markov chain Monte Carlo method based on the analysis result (step S7). Next, the search part 84 determines whether the parameter search operations represented in steps S3 to S7 have been repeated a preset number of times (step S9). When the search part 84 determines that the set number of times has not been repeated, the process returns to step S1 and the parameter search operations of steps S3 to S7 are executed again. When the search part 84 determines in step S9 that S3 to S7 have been repeated the preset number of times, the powers $p_1$ to $p_n$ and the phases $\varphi_1$ to $\varphi_{n-1}$ represented by the matrix A having the longest staying time from a staying time histogram prepared by repeating the parameter search operation are determined as the next parameters, thereby correcting the density distribution of local plasma (step S11).

Thus, each antenna part 11 of the phased array antenna 2 is controlled at the next substrate processing with the determined powers $p_1$ to $p_n$ and phases $\varphi_1$ to $\varphi_{n-1}$.

As described above, the control method according to the embodiment is a method of controlling the scanning type plasma processing apparatus 10 using the phased array antenna 2, in which the method includes: observing the emission of plasma generated inside the processing container 1 through the observation windows 12 provided at multiple positions in the processing container 1; calculating an in-plane distribution (e.g., a plasma density distribution) on a substrate having values representing the characteristics of the plasma based on the observed data regarding the emission of the plasma; and correcting the scanning pattern of the plasma and/or the plasma density distribution based on the in-plane distribution on the substrate having the calculated value showing the characteristics of the plasma.

According to the plasma processing apparatus 10 of the present embodiment, the scanning pattern and/or the plasma density distribution of local plasma are corrected by changing the power and the phase of microwaves supplied from each antenna part 11 of the phased array antenna 2. This makes it possible to freely control the combination of microwaves by controlling the power and phase of the microwaves, and thus to correct the time-integrated values of plasma density to an ideal spatial distribution.

For example, due to the influence of non-uniformity of gas flow and a structure (e.g., a mounting error or a processing tolerance) that cannot be expressed by electromagnetic field simulation or plasma simulation, a plasma density distribution ρ different from the assumed ideal values on the right of FIG. 6 may be generated, as illustrated on the left of FIG. 6. In this case, it is necessary to readjust the power distribution and the phase of each antenna part 11 of the phased array antenna 2. In this case, by obtaining a density distribution (e.g., an emission intensity distribution) of chemical species that has a strong correlation with process results based on the spectroscopic measurement, even if a substrate W is not actually processed, it is possible to estimate the plasma density at a certain point on the substrate W at a certain time, and thus to estimate a two-dimensional plasma density distribution on the substrate W. Based on the estimated plasma density distribution, it is possible to estimate a film forming rate and an etching rate experienced at a certain point on the substrate W at a certain time.

Further, by referring to a distribution of process speeds such as estimated film forming rates and etching rates, it is possible to narrow down the appropriate power and phase parameters with a smaller substrate consumption amount, and thus to set the power and phase parameters to the ideal values of the plasma density distribution illustrated on the right of FIG. 6 or to bring the power and phase parameters close to the ideal values.

For example, when the estimated values of the plasma density distribution illustrated on the left of FIG. 11 are not uniform unlike the ideal values illustrated on the right of FIG. 11, the final film forming amount or etching amount is not uniform in the plane of a substrate W. In this case, in order to make the final film forming amount or etching amount uniform in the plane of the substrate W, it is necessary to readjust, for example, the radiation time of local plasma. In this case, a sweep condition, that is, a scanning pattern of plasma is corrected such that the time-integrated values of plasma density obtained based on a plasma emission distribution measured by spectroscopic measurement become uniform at all positions in the plane of the substrate. The scanning pattern of plasma is corrected by adjusting the power p and the phase φ by the power/phase controller 7. Thus, it can be expected to improve the uniformity of the film forming amount or etching amount in the plane of the substrate W. According to the control method of the present embodiment, it is possible to reduce the number of times of actually performing the process for adjusting the parameters of the power p and the phase φ. Thus, it is possible to reduce the trial and error process evaluation so that the number of consumed substrates can also be reduced and labor, time, and costs can be saved.

In the "step of correcting the plasma scanning pattern" illustrated in step S11 of FIG. 9, the power and/or the phase output from at least one of the antenna parts 11 of the phased array antenna 2 may be controlled.

In addition, in the "step of correcting the plasma scanning pattern", the time for supplying power output from at least one antenna part 11 of the phased array antenna 2 may be controlled.

The "step of correcting the plasma scanning pattern" may be performed at any time if the following occurs alone or in combination: i) before processing the substrate W, ii) after performing maintenance on the plasma processing apparatus 10, and iii) after changing recipe data used in the plasma processing apparatus 10.

In addition, based on the data about the emission of plasma observed during the processing of one substrate W, the "step of correcting the plasma scanning pattern" may be performed in the first step of a subsequent substrate W to be processed after the processing of the substrate W. The control method according to the present embodiment may be performed at the timing of process development, after maintenance of the plasma processing apparatus 10, or the like. Further, the control method according to the present embodiment may be used for real-time control in which the power and/or the phase of each antenna part 11 of the phased array antenna 2 during the next substrate processing is controlled based on the emission intensity data obtained during the previous substrate processing.

[Control Method During Substrate Processing]

Figure 10:
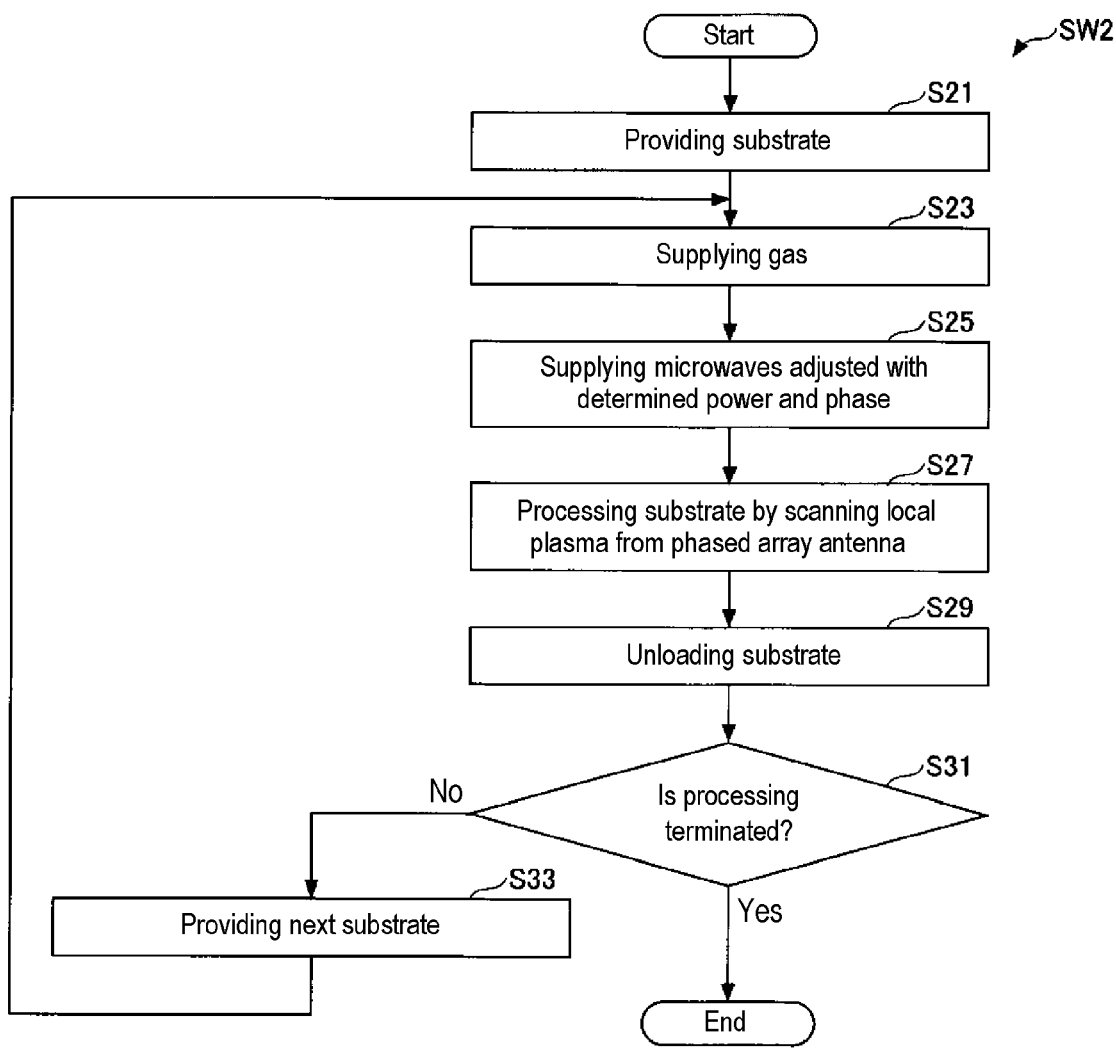
FIG. 10 is a flowchart illustrating an exemplary control method (substrate processing) according to an embodiment.

Next, a control method (substrate processing) SW2 executed by the plasma processing apparatus 10 will be described with reference to FIG. 10. FIG. 10 is a flowchart illustrating an exemplary control method SW2 according to an embodiment. This processing is controlled by the controller 8.

First, the controller 8 loads a substrate W into the processing container 1 and places the substrate W on the stage 3 so as to prepare the substrate W (step S21). Next, the controller 8 supplies a predetermined gas from the gas supply part 21 (step S23).

Next, the controller 8 adjusts the power p and the phase φ of microwaves radiated from each of the antenna part 11 of the monopole antennas 2a to 2g to one of determined powers $p_1$ to $p_n$ and phases $\varphi_1$ to $\varphi_{n-1}$ using the power/phase controller 7, and supplying the microwaves having the adjusted power and phase (step S25). The microwaves having the controlled power and phase can be combined at a predetermined position of the dielectric window 5 while interfering with each other in the space V. Thus, the local plasma generated between the dielectric window 5 and the stage 3 is scanned to process the substrate W (step S27). Next, the controller 8 unloads the processed substrate W (step S29).

Next, the controller 8 determines whether to terminate the processing of the substrate W (step S31). When there is the next substrate W, the controller 8 determines that the processing of the substrate W is not terminated, prepares the next substrate W (step S33), returns to step S23, and executes steps S23 to S27 so as to process the next substrate W by the local plasma.

In step S31, when there is no next substrate W, the controller 8 determines to terminate the processing of the substrate W, and terminates the processing. When terminating the processing, the output of microwaves is stopped, and the supply of gas is stopped.

[Learning]

Figure 12:
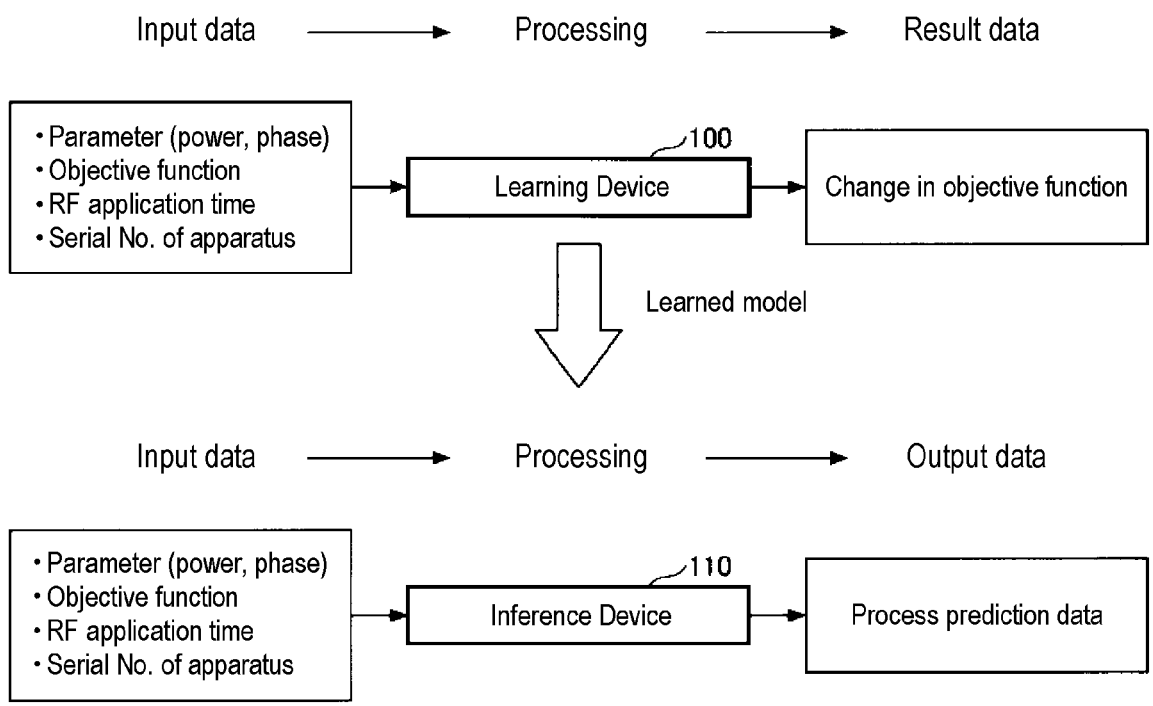
FIG. 12 is a view for describing a learning method of process prediction data according to an embodiment.

A method for learning and inferring process prediction data will be described with reference to FIG. 12. FIG. 12 is a view for explaining how to learn and infer process prediction data in a substrate processing according to an embodiment.

In the learning step illustrated in FIG. 12 (top), parameters (power and phase), an objective function, an RF application time, and a serial number of the plasma processing apparatus 10 are used as input data. The parameters are the power and phase controlled by the power/phase controller 7. The objective function may be emission intensity data acquired at a series of operation timings or a plasma density distribution ρ estimated based on the emission intensity data. The RF application time is an example of elapsed time. The elapsed time may be the time elapsed from a new product state of the plasma processing apparatus 10 or from the initial state after the maintenance of the plasma processing apparatus 10. The serial number of the plasma processing apparatus 10 is an example of a unique identification number of the plasma processing apparatus 10.

A learning device 100 is a device that performs machine learning such as deep learning. By inputting input data to the learning device 100, a change in the objective function according to the elapsed time of each plasma processing apparatus 10 is learned. After learning, a learning-completed model obtained by learning is applied to an inference device 110. The learning device 100 and the inference device 110 may be the same device or different devices. For example, the learning-completed model is composed of a learning-completed program and parameters that are a set of learned numerical values of the learning-completed model.

In the inference step illustrated in FIG. 12 (bottom), parameters (power and phase), an objective function, an RF application time, and the serial number of the plasma processing apparatus 10 are input as input data to the inference device 110 incorporating the learning-completed model. The inference device 110 predicts a change in the objective function according to the elapsed time of the plasma processing apparatus 10 identified by the input serial number, and outputs process prediction data.

Examples of the process prediction data may include the images of plasma density distributions shown in FIGS. 6 and 11. The inference device 110 is able to predict the change in the objective function according to the elapsed time of each plasma processing apparatus 10. Thus, the inference device 110 is able to output an image of an appropriate plasma density distribution obtained by changing the image of the plasma density distribution depending on a machine difference or a change due to aging of the plasma processing apparatus 10. This makes it possible to predict an area where the plasma density distribution is easy to change or an area where the plasma density distribution is difficult to change, from the output image of the plasma density distribution without actually performing the process.

The plasma density distribution is an example of process prediction data, but is not limited thereto. In the case of film formation, other examples of the process prediction data include process prediction data representing a film thickness, a film forming rate distribution, and other film forming characteristics. In the case of etching, other examples of the process prediction data include process prediction data representing an etching shape, an etching depth, an etching rate distribution, and other etching characteristics.

Note that the plasma processing apparatus of the present disclosure has been described by taking a plasma processing apparatus that radiates microwaves as an example, but the present invention is not limited to this. The phased array antenna included in the plasma processing apparatus of the present disclosure is not limited to microwaves, and may emit electromagnetic waves having a frequency of 100 MHz or higher, such as UHF. More preferably, the phased array antenna radiates electromagnetic waves having a frequency in the range of 1 GHz to 3 GHz. In addition, the antenna forming the phased array antenna is not limited to a monopole antenna, and other antennas such as a helical antenna and a patch antenna may be used.

According to an aspect, it is possible to control local plasma using a phased array antenna.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of controlling a scanning-type plasma processing apparatus using a phased array antenna, the method comprising:
    observing light emission of plasma generated inside a processing container through observation windows provided at multiple positions in the processing container;
    calculating an in-plane distribution of values representing characteristics of the plasma on a substrate, based on data on the observed light emission of the plasma; and
    correcting at least one or more of a scanning pattern or a plasma density distribution of the plasma based on the calculated in-plane distribution of the values representing the characteristics of the plasma on the substrate,
    wherein the correcting the at least one or more of the scanning pattern or the plasma density distribution of the plasma includes: predicting a change in an objective function representing the plasma density distribution and determining a result of the correcting the at least one or more of the scanning pattern or the plasma density distribution of the plasma, by inputting, to an inference device incorporating a learning-completed model obtained by learning a change in the objective function according to an elapsed time of the plasma processing apparatus, power and phase output from at least one antenna part of the phased array antenna, the elapsed time, and the objective function.

2. The method of claim 1, wherein the correcting the at least one or more of the scanning pattern or the plasma density distribution of the plasma includes controlling the at least one or more of power and phase output from the at least one antenna part of the phased array antenna.

3. The method of claim 2, wherein the correcting the at least one or more of the scanning pattern or the plasma density distribution of the plasma includes controlling a time for supplying power output from the at least one antenna part of the phased array antenna.

4. The method of claim 3, wherein the correcting the at least one or more of the scanning pattern or the plasma density distribution of the plasma is performed at least at any one of a timing among before processing the substrate, a timing after maintenance of the plasma processing apparatus, and a timing after changing recipe data used in the plasma processing apparatus.

5. The method of claim 4, wherein the correcting the at least one or more of the scanning pattern or the plasma density distribution of the plasma is performed, based on the data on light emission of the plasma observed during a process of one substrate, in a first step of a subsequent substrate to be processed after the process of the substrate.

6. The method of claim 5, wherein the values representing the characteristics of the plasma include any one of a density of the plasma, an emission intensity of the plasma, a processing rate of the substrate by the plasma, and a value representing a processing result of the substrate by the plasma.

7. The method of claim 1, wherein the correcting the at least one or more of the scanning pattern or the plasma density distribution of the plasma includes controlling a time for supplying power output from the at least one antenna part of the phased array antenna.

8. The method of claim 1, wherein the correcting the at least one or more of the scanning pattern or the plasma density distribution of the plasma is performed at least at any one of a timing among before processing the substrate, a timing after maintenance of the plasma processing apparatus, and a timing after changing recipe data used in the plasma processing apparatus.

9. The method of claim 1, wherein the correcting the at least one or more of the scanning pattern or the plasma density distribution of the plasma is performed, based on the data on light emission of the plasma observed during a process of one substrate, in a first step of a subsequent substrate to be processed after the process of the substrate.

10. The method of claim 1, wherein the values representing the characteristics of the plasma include any one of a density of the plasma, an emission intensity of the plasma, a processing rate of the substrate by the plasma, and a value representing a processing result of the substrate by the plasma.

11. A plasma processing apparatus comprising:
    a processing container;
    a gas supply part configured to supply a gas into the processing container;
    a phased array antenna configured to emit electromagnetic waves into the processing container;
    a light emission monitoring mechanism configured to observe light emission of plasma generated in the processing container through observation windows provided at multiple positions in the processing container; and
    a controller configured to: calculate an in-plane distribution of values representing characteristics of the plasma on a substrate, based on data on the observed light emission of the plasma; and correct at least one or more of a scanning pattern or a plasma density distribution of the plasma based on the calculated in-plane distribution of the values representing the characteristics of the plasma on the substrate,
    wherein, to correct the at least one or more of the scanning pattern or the plasma density distribution of the plasma, the controller is further configured to: predict a change in an objective function representing the plasma density distribution and determine a result of the correcting the at least one or more of the scanning pattern or the plasma density distribution of the plasma, by inputting, to an inference device incorporating a learning-completed model obtained by learning a change in the objective function according to an elapsed time of the plasma processing apparatus, power and phase output from at least one antenna part of the phased array antenna, the elapsed time, and the objective function.

* * * * *